United States Patent
Brist et al.

(10) Patent No.: US 7,480,435 B2
(45) Date of Patent: *Jan. 20, 2009

(54) EMBEDDED WAVEGUIDE PRINTED CIRCUIT BOARD STRUCTURE

(75) Inventors: Gary A. Brist, Yamhill, OR (US); Bryce D. Horine, Portland, OR (US); Stephen H. Stephen, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/322,601

(22) Filed: Dec. 30, 2005

(65) Prior Publication Data

US 2007/0154155 A1 Jul. 5, 2007

(51) Int. Cl.
*G02B 6/10* (2006.01)
(52) U.S. Cl. .................. 385/129; 385/130; 385/131
(58) Field of Classification Search .......... 385/129–131
See application file for complete search history.

(56) References Cited

U.S. PATENT DOCUMENTS

| | | | |
|---|---|---|---|
| 3,157,847 A | 11/1964 | Williams | |
| 6,072,699 A | 6/2000 | Horine | |
| 6,144,576 A | 11/2000 | Leddige et al. | |
| 6,175,239 B1 | 1/2001 | Hall | |
| 6,249,142 B1 | 6/2001 | Hall et al. | |
| 6,346,842 B1 | 2/2002 | Hall, Jr. et al. | |
| 6,353,539 B1 | 3/2002 | Horine et al. | |
| 6,362,973 B1 | 3/2002 | Leddige et al. | |
| 6,366,466 B1 | 4/2002 | Leddige et al. | |
| 6,429,383 B1 | 8/2002 | Sprietsma et al. | |
| 6,477,614 B1 | 11/2002 | Leddige et al. | |
| 6,587,912 B2 | 7/2003 | Leddige et al. | |
| 6,642,158 B1 | 11/2003 | Brist et al. | |
| 6,674,648 B2 | 1/2004 | McCall et al. | |
| 6,737,883 B2 | 5/2004 | Hall | |
| 6,747,216 B2 | 6/2004 | Brist et al. | |
| 6,788,222 B2 | 9/2004 | Hall et al. | |
| 6,803,527 B2 | 10/2004 | Dishongh et al. | |
| 6,882,762 B2 * | 4/2005 | Brist et al. | 385/14 |
| 6,891,899 B2 | 5/2005 | Hall et al. | |
| 6,916,183 B2 | 7/2005 | Alger et al. | |
| 6,992,899 B2 | 1/2006 | Alger et al. | |
| 7,020,792 B2 | 3/2006 | Hall | |
| 7,022,919 B2 | 4/2006 | Brist et al. | |
| 7,043,706 B2 | 5/2006 | Brist et al. | |
| 7,064,063 B2 | 6/2006 | Brist et al. | |
| 7,121,841 B2 | 10/2006 | Alger et al. | |
| 7,145,243 B2 | 12/2006 | Brist et al. | |
| 2003/0059151 A1 | 3/2003 | Brist et al. | |

(Continued)

OTHER PUBLICATIONS

Intel, U.S. Appl. No. 11/319,875, Hall et al., filed Dec. 27, 2005.

(Continued)

*Primary Examiner*—Jennifer Doan
(74) *Attorney, Agent, or Firm*—Robert D. Anderson (57) ABSTRACT

In some embodiments a channel is formed in printed circuit board material, the formed channel is plated to form at least two side walls of an embedded waveguide, and printed circuit board material is laminated to the plated channel. Other embodiments are described and claimed.

29 Claims, 9 Drawing Sheets

U.S. PATENT DOCUMENTS

| | | |
|---|---|---|
| 2003/0169133 A1 | 9/2003 | Torigoe |
| 2005/0000816 A1 | 1/2005 | Lin |
| 2005/0063637 A1 | 3/2005 | Mershon et al. |
| 2005/0063638 A1 | 3/2005 | Alger et al. |
| 2005/0208749 A1 | 9/2005 | Beckman et al. |
| 2005/0221066 A1 | 10/2005 | Brist et al. |
| 2006/0123371 A1 | 6/2006 | Brist et al. |
| 2006/0148281 A1 | 7/2006 | Horine et al. |
| 2006/0258184 A1 | 11/2006 | Alger et al. |
| 2007/0000687 A1 | 1/2007 | Brist et al. |
| 2007/0001789 A1 | 1/2007 | Suarez-Gartner et al. |
| 2007/0001907 A1 | 1/2007 | Hall et al. |
| 2007/0037432 A1 | 2/2007 | Mershon et al. |

OTHER PUBLICATIONS

Intel, U.S. Appl. No. 11/322,488, Brisk et al., filed Dec. 30, 2005.
Intel, U.S. Appl. No. 11/322,964, Horine et al., filed Dec. 30, 2005.
Intel, U.S. Appl. No. 11/322,995, Horine et al., filed Dec. 30, 2005.
Intel, U.S. Appl. No. 10/409,890, Sato et al., filed Apr. 8, 2003.
Intel, U.S. Appl. No. 11/468,244, Alger et al., filed Aug. 29, 2006.
Intel, U.S. Appl. No. 11/282,874, Alger et al., filed Nov. 17, 2005.
International Search Report and Written Opinion of the International Searching Authority; Dated Jun. 29, 2007: PCT/US2006/048090; 10 pgs.

* cited by examiner

EMBEDDED WAVEGUIDE PRINTED CIRCUIT BOARD STRUCTURE

RELATED APPLICATIONS

This application is related to U.S. patent application Ser. No. 11/322,995 entitled "Printed Circuit Board Waveguide", filed on even date herewith and with the same inventors as the present application.

This application is related to U.S. patent application Ser. No. 11/322,488 entitled "Imprinted Waveguide Printed Circuit Board Structure", filed on even date herewith and with the same inventors as the present application.

This application is also related to U.S. patent application Ser. No. 11/322,964 entitled "Quasi-Waveguide Printed Circuit Board Structure", filed on even date herewith and with the same inventors as the present application.

TECHNICAL FIELD

The inventions generally relate to an embedded waveguide printed circuit board (PCB) structure.

BACKGROUND

As Moore's Law drives the bandwidth of data buses increasingly higher, fundamental roadblocks associated with traditional microstrip and stripline transmission line structures limit channel speeds to frequencies lower than 15-20 gigabits per second. The signaling limits are fundamentally associated with transmission line losses caused by both the dielectric and the copper as well as the propagation modes supported by the microstrip and stripline structures. Further, the implementation of high performance dielectrics with standard transmission line structures might provide a minimal increase in bandwidth but at a significant increase in cost.

As signaling frequencies and carrier frequencies for modulated signals rise beyond 15-20 gigabits per second and increase toward 20-50 GHz and beyond, the standard microstrip and stripline structures become less effective as transmission structures. An alternative method of signal propagation is therefore required. In order to ensure a minimal loss and to guide the energy of such high frequencies, one solution might be to use waveguide structures. Waveguides are typically devices that control the propagation of an electromagnetic wave so that the wave is forced to follow a path defined by the physical structure of the guide. Standard waveguides cannot easily be integrated within a digital system based on current printed circuit board (PCB) process technology. Therefore, a need has arisen for an improved PCB waveguide.

BRIEF DESCRIPTION OF THE DRAWINGS

The inventions will be understood more fully from the detailed description given below and from the accompanying drawings of some embodiments of the inventions which, however, should not be taken to limit the inventions to the specific embodiments described, but are for explanation and understanding only.

DETAILED DESCRIPTION

Some embodiments of the inventions relate to an embedded waveguide printed circuit board (PCB) structure. Some embodiments relate to a process of forming an embedded waveguide.

Some embodiments relate to an imprinted waveguide PCB structure. Some embodiments relate to a process of forming an imprinted waveguide.

Some embodiments relate to a quasi-waveguide PCB structure. Some embodiments relate to a process of forming a quasi-waveguide.

In some embodiments a printed circuit board is fabricated using printed circuit board material, and a waveguide is formed that is contained within the printed circuit board material.

In some embodiments a printed circuit board includes printed circuit board material and a waveguide contained within the printed circuit board material.

In some embodiments a channel is formed in printed circuit board material, the formed channel is plated to form at least two side walls of an embedded waveguide, and printed circuit board material is laminated to the plated channel.

In some embodiments an embedded waveguide includes a channel formed in printed circuit board material, at least two plated side walls of the channel, and printed circuit board material laminated to the channel.

In some embodiments a channel is formed by combining two imprinted subparts each made of printed circuit board material and the imprinted subparts are laminated to form a waveguide.

In some embodiments a waveguide includes two imprinted subparts each made of printed circuit board material and a channel between the imprinted subparts to form a waveguide.

In some embodiments a channel is formed in printed circuit board material, the formed channel is plated to form at least two side walls of a quasi-waveguide, and printed circuit board material is laminated to the plated channel using thermoset adhesive.

In some embodiments a quasi-waveguide includes a channel formed in printed circuit board material, two plated side walls of the channel, and printed circuit board material laminated to the channel.

Some embodiments relate to an air filled waveguide. An air filled waveguide provides the lowest possible loss for any type of waveguide. In a waveguide the majority of the energy is concentrated in the dielectric instead of the conductor. Therefore, by using air in the waveguide instead of filling it with another material the channel losses are minimized.

According to some embodiments, even though an air filled waveguide is most beneficial from a loss perspective, a waveguide can be filled with a material other than air (for example, for manufacturing and/or reliability concerns). All of the waveguides discussed, described and/or illustrated herein can be filled with a material other than air according to some embodiments, even where the waveguide is discussed, described and/or illustrated herein as being air filled.

According to some embodiments waveguides propagate energy much more efficiently than standard transmission line structures at high frequencies and can be used to extend the bandwidth of standard, low cost PCB channel technology (for example, to frequencies of 100-200 GHz).

According to some embodiments air filled waveguides are fabricated using existing PCB materials and processes.

According to some embodiments air dielectric waveguides are used within a PCB.

According to some embodiments standard low cost FR4 epoxy printed circuit materials may be used in forming a waveguide in a PCB.

According to some embodiments very high speed buses may be implemented in a PCB of a digital system and/or in a radio frequency (RF) integrated PCB (for example, for use in telecom devices).

According to some embodiments a PCB waveguide is used to extend signaling (for example, beyond 20-30 GHz) using FR4 materials and existing PCB manufacturing processes.

According to some embodiments a waveguide interconnect structure using FR4 materials helps eliminate the variation of dielectric loss and cross talk.

According to some embodiments a structure, process, material selection and fabrication of a PCB interconnect waveguide is provided.

According to some embodiments a waveguide is created by forming a channel into a dielectric or multilayer PCB composite (for example, by routing, punching, using a laser, or etching). The channel is then plated to form two side walls of the waveguide. In some embodiments depending on the method and process used, a top and/or bottom wall is also formed. Remaining walls of the channels can be constructed in a similar fashion.

According to some embodiments a waveguide is created by laminating PCB subparts containing a top, a bottom, and side walls of the waveguide. When using thermoset adhesives and/or prepregs, the adhesive in the area of the channel is removed prior to lamination. In some embodiments the adhesive removal extends back away from the edges of the channel (for example, 20+ mils) to provide a buffer for material movement and adhesive flow during lamination.

According to some embodiments thermoplastic cap layers are used to provide top and/or bottom waveguide surfaces. The thermoplastic material acts as an adhesive and the etched metal defining the waveguide surface is made slightly larger than the waveguide channel to account for material movement during lamination.

Figure 1:
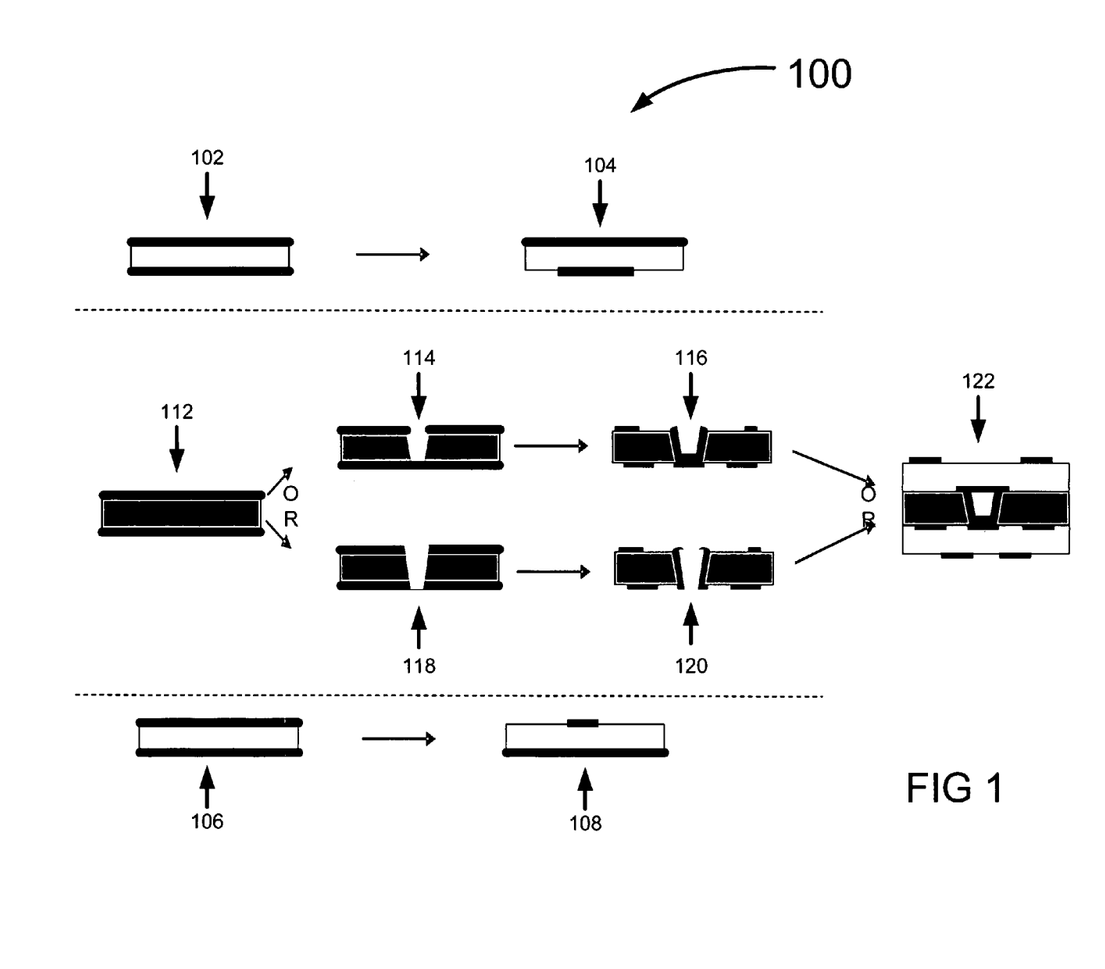
FIG. 1 illustrates a process of forming an embedded waveguide according to some embodiments of the inventions.

FIG. 1 illustrates a process 100 of forming a waveguide according to some embodiments. According to some embodiments process 100 uses thermoplastic properties of a thermoplastic cap material to adhere a top and/or bottom cap of the waveguide during lamination.

The top portion of process 100 of FIG. 1 illustrates at 102 a copper clad thermoplastic dielectric core or multilayer structure. According to some embodiments, the copper clad thermoplastic dielectric core or multilayer structure shown at 102 has a bottom dielectric that is a thermoplastic. The bottom copper layer is imaged at 104. The bottom copper layer shown at 104 includes a conductor for an air dielectric waveguide to be formed.

Similarly to the top portion of process 100 of FIG. 1, the bottom portion of process 100 includes at 106 a copper clad thermoplastic dielectric core or a multilayer structure with a top dielectric being a thermoplastic. The top copper layer of the structure at 102 is imaged at 108. This imaged top copper layer at 108 contains a bottom conductive region for the waveguide (for example, for a channel and/or for a trench if the central core is plated, or, for example, a cavity if the central core is imaged).

The middle portion of process 100 of FIG. 1 illustrated two alternative processes used to form the central core. A copper clad two sided or multilayer core is shown at 112. Two alternatives are shown in FIG. 1. The first alternative includes 114 and 116 and the second alternative includes 118 and 120. In the first alternative, a channel, trench, and/or cavity are formed at 114 in the copper clad two sided or multilayer core shown at 112. The channel, trench and/or cavity are formed by a laser and/or plasma using copper as the ablation/etch stop at 114. At 116 the core is plated and etched with copper support on one side of the channel/trench/cavity (for example, on the bottom side as shown in FIG. 1). In the second alternative a channel/trench/cavity is routed, punched, etched, and/or lased through the core at 118. At 120 the core is plated and etched with the top and bottom of the channel/trench/cavity left open.

At 122 the pieces from the top, middle and bottom portions of process 100 are combined. At 122 thermoplastic dielectrics are laminated to the plated core containing the channel/trench/cavity. Additionally, outer layer features are drilled, plated, imaged, and/or etched, etc. as needed. According to some embodiments the end result of step 122 is a PCB having an embedded waveguide according to some embodiments. According to some embodiments, a key to the process 100 of FIG. 1 is using the thermoplastic properties of the cap material to adhere the top and/or bottom cap of the waveguide during lamination.

Figure 2:
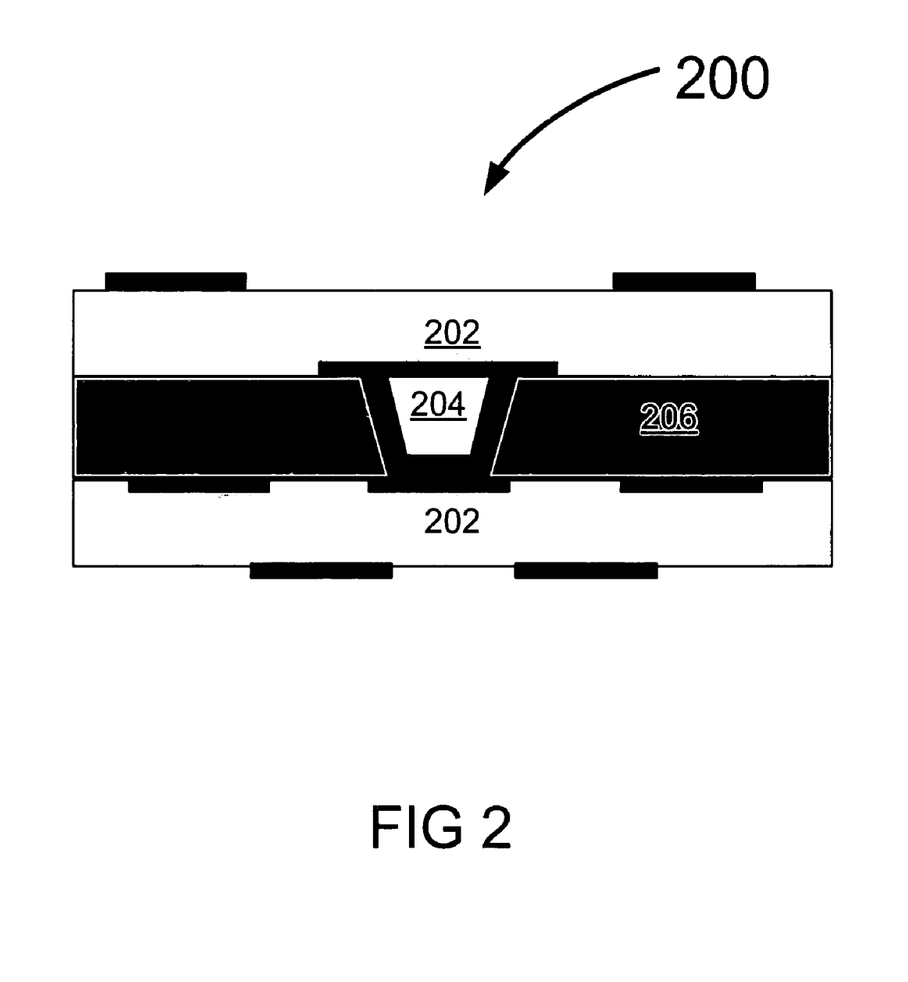
FIG. 2 illustrates an embedded waveguide according to some embodiments of the inventions.

FIG. 2 illustrates an embedded waveguide 200 according to some embodiments. According to some embodiments waveguide 200 may have been formed using the process 100 illustrated in FIG. 1, for example. Embedded waveguide 200 includes a thermoplastic cap dielectric 202 and an air channel 204 defined by a plated core 206.

According to some embodiments, process 100 and waveguide 200 relate to an air filled waveguide. An air filled waveguide provides the lowest possible loss for a waveguide. In a waveguide the majority of the energy is concentrated in the dielectric instead of the conductor. Therefore, by using air in the waveguide instead of filling it with another material the channel losses are minimized.

Figure 3:
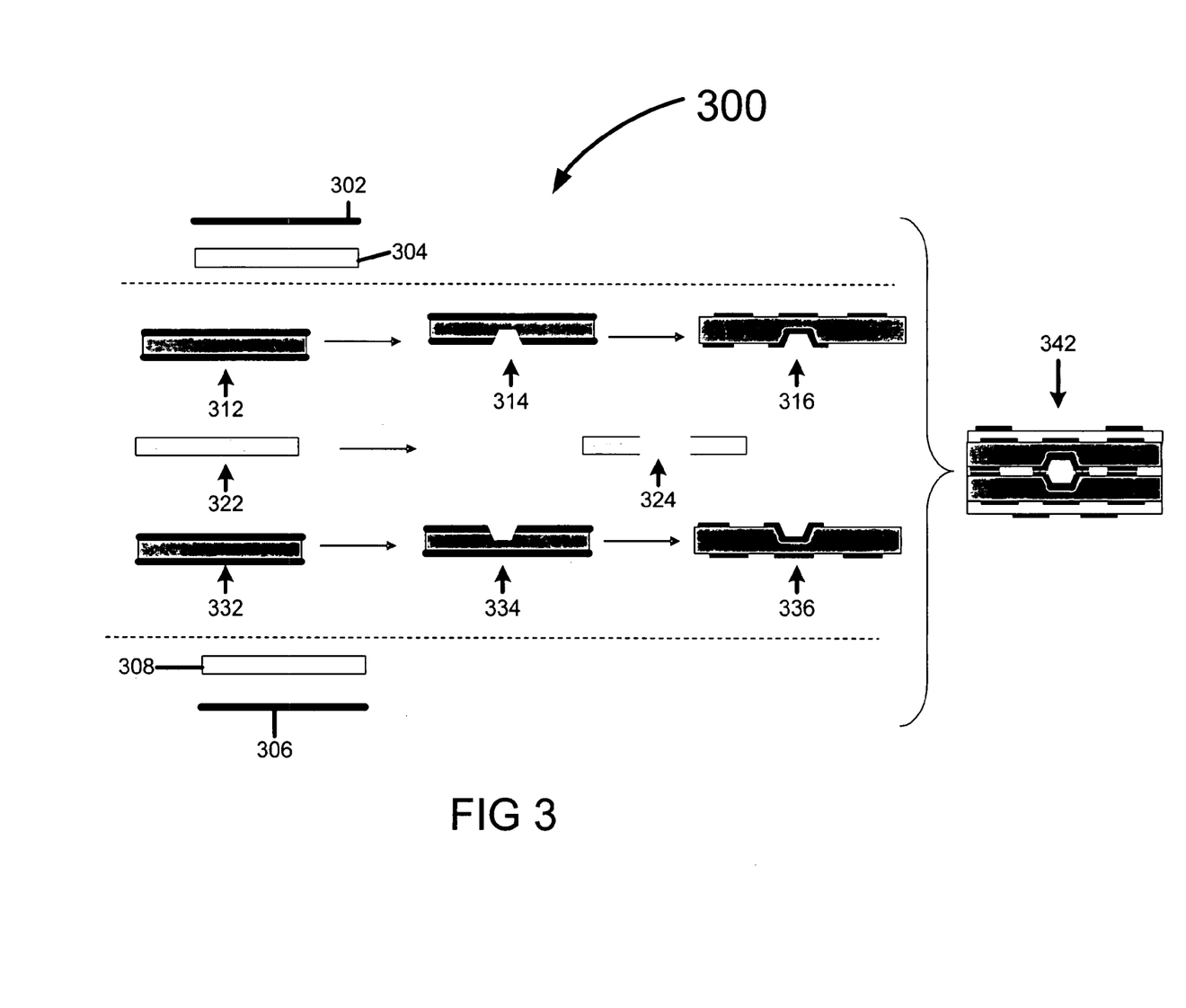
FIG. 3 illustrates a process of forming an embedded waveguide according to some embodiments of the inventions.

FIG. 3 illustrates a process 300 of forming a waveguide according to some embodiments. According to some embodiments process 300 uses thermoset FR4 materials.

The top portion of process 300 of FIG. 3 illustrates a copper foil 302 and a prepreg layer 304 that form a top portion of the waveguide PCB supporting traditional conductors. Similarly, the bottom portion of process 300 of FIG. 3 illustrates a copper foil 306 and a prepreg layer 308 that form a bottom portion of the waveguide PCB supporting traditional conductors.

A copper clad core and/or multilayer is provided at 312 and a channel, trench and/or cavity is formed (for example, routed, punched, etched, and/or lased, etc.) in a portion of that copper clad core and/or multilayer at 314. Then, at 316 the core is plated and etched with the top and/or bottom of the channel/trench/cavity open to form a top portion of the waveguide.

A low-flow or no-flow adhesive is provided at 322. This adhesive is routed, punched, etched, and/or lased etc. at 324 to form a channel, trench and/or cavity through the adhesive.

A copper clad core and/or multilayer is provided at 332 and a channel, trench and/or cavity is formed (for example, routed, punched, etched, and/or lased, etc.) in a portion of that copper clad core and/or multilayer at 334. Then, at 336 the core is plated and etched with the top and/or bottom of the channel/trench/cavity open to form a bottom portion of the waveguide.

The results of copper foil 302, prepreg 304, plated and etched core at 316, adhesive with cavity at 324, plated and etched core at 336, prepreg 308, and/or copper foil 306 is combined at 342. A conductor is laminated over the channel/trench/cavity at 342 using the lased/punched low flow or non-flow adhesives. Outer layer features are drilled, plated, imaged, etc. as needed.

According to some embodiments, a key to the process 300 is generating an opening clearance in the prepreg/adhesive layer that is slightly larger than the waveguide formed by the channel/trench/cavity to prevent adhesive flow into the waveguide during lamination.

Figure 4:
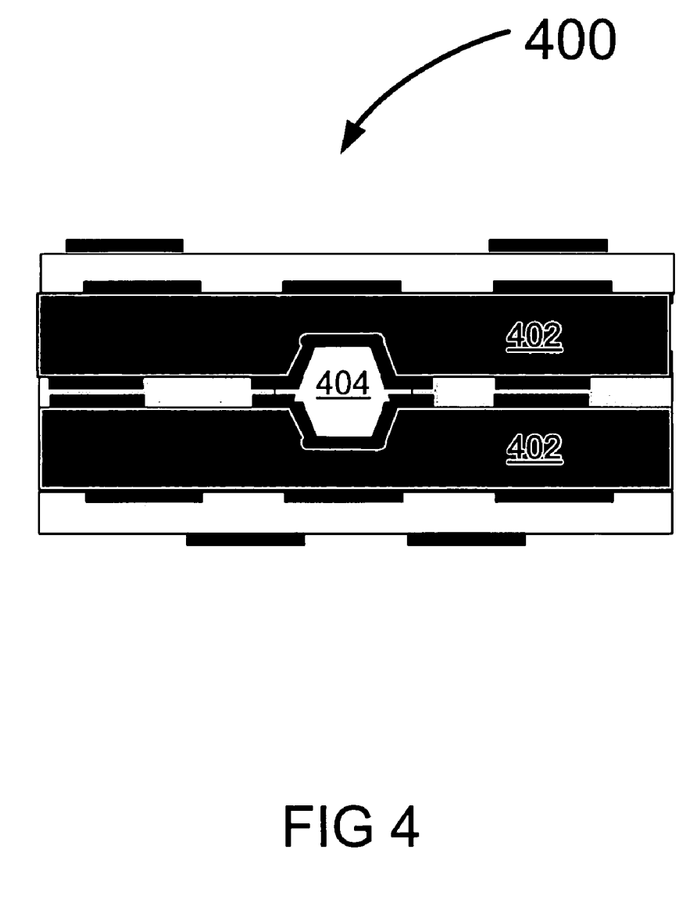
FIG. 4 illustrates an embedded waveguide according to some embodiments of the inventions.

FIG. 4 illustrates an embedded waveguide 400 according to some embodiments. According to some embodiments waveguide 400 may have been formed using the process 300 illustrated in FIG. 3, for example. Embedded waveguide 400 includes a thermoset cap dielectric 402 (for example, a standard thermoset cap dielectric) and a waveguide channel 404 defined by controlled depth plated cavities as described above and in process 300, for example.

According to some embodiments waveguide 400 is an air filled waveguide and process 300 is a process to form an air filled waveguide which has the benefits listed above (for example, lowest dielectric losses). Having low dielectric losses is a significant benefit for waveguides since most of the energy is in the dielectric rather than in a conductor. On the other hand, when some of the energy is in the copper conductor and some is in the dielectric, a smaller benefit results from a lower loss dielectric.

According to some embodiments air dielectric waveguides within a PCB may be used to scale standard low cost FR4 epoxy printed circuit materials (for example, to frequencies such as 100-200 GHz or more).

According to some embodiments a waveguide is created within a Printed Circuit Board (PCB) using an imprinting method for high volume manufacturing.

According to some embodiments signals may be propagated on a PCB that would remove fundamental roadblocks associated with multi-Gigabit bus design without a significant increase in cost.

According to some embodiments waveguide structures are created in PCBs by relying on bonding subparts containing plated channels, cavities and/or trenches. According to some embodiments imprinting allows the channel, trench and/or cavity of the waveguide to be formed in a single step, eliminating much of the fabrication process required by non-imprint methods.

According to some embodiments an efficient low cost manufacturing methodology is provided to implement waveguides using standard FR4 material. The waveguide is formed with an imaged or unimaged copper clad dielectric by imprinting the top and/or bottom portion of the waveguide into a dielectric with a master die pattern. The top and bottom portions are then laminated together to form a waveguide.

According to some embodiments signaling roadblocks caused by traditional transmission line structures are removed without a significant increase in board cost.

According to some embodiments a low cost method of extending signaling beyond 15-10 gigabits per second is provided using FR4 materials and existing PCB manufacturing processes.

According to some embodiments low cost imprinting methods are used (for example, similar to the manufacture of CDs) to fabricate high performance PCBs.

Figure 5:
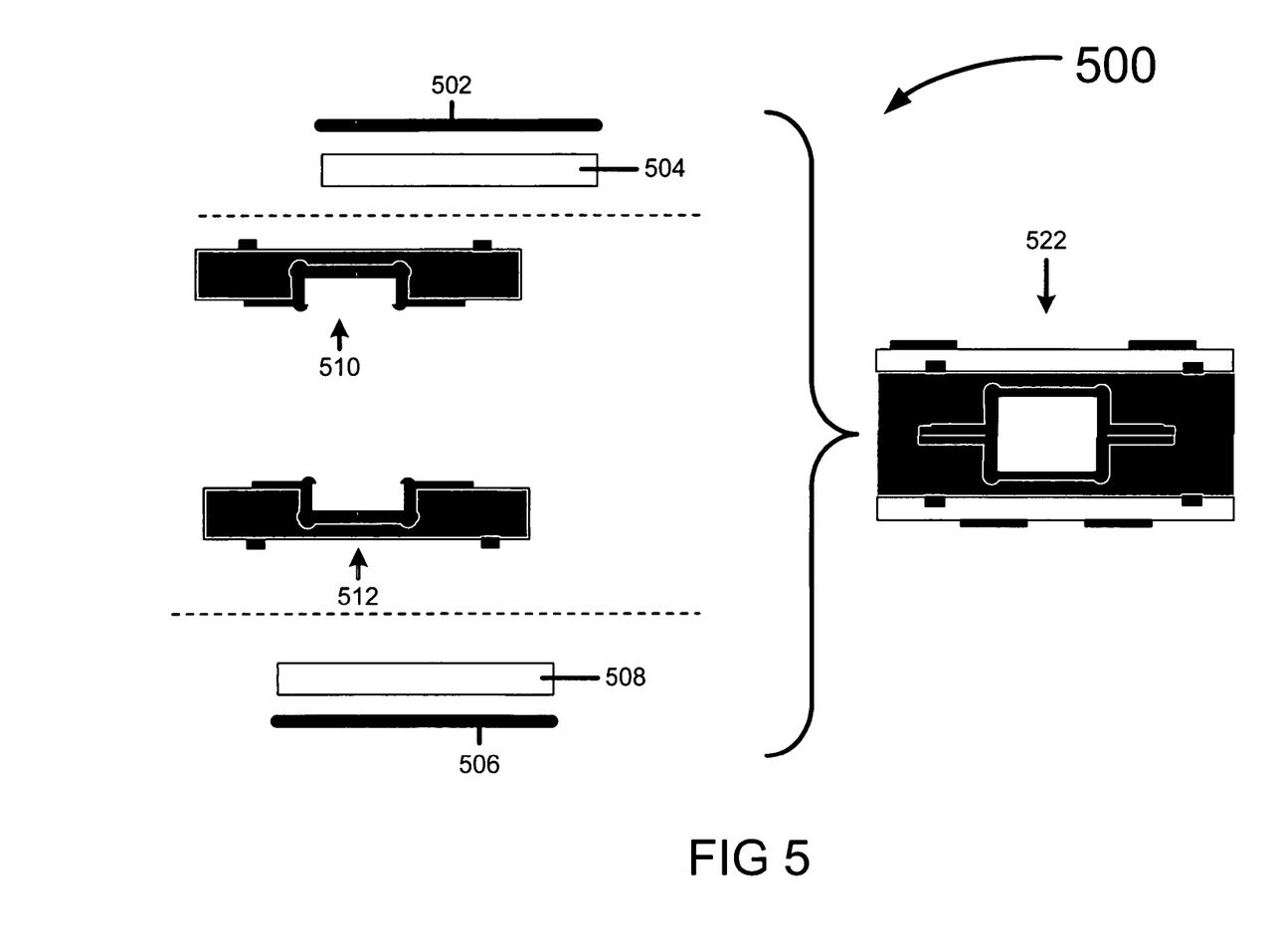
FIG. 5 illustrates a process of forming an imprinted waveguide according to some embodiments of the inventions.

FIG. 5 illustrates a process 500 of forming a waveguide according to some embodiments. According to some embodiments process 500 uses imprinted thermoplastic dielectrics to fabricate a waveguide.

At a top portion illustrated in FIG. 5, process 500 includes using a copper foil 502 and a prepreg 504 to form a top portion of the waveguide PCB supporting traditional conductors. Similarly, at a bottom portion illustrated in FIG. 5, process 500 includes using a copper foil 506 and a prepreg 508 to form a bottom portion of the waveguide PCB supporting traditional conductors.

At 522 of process 500, the copper foil 502, prepreg 504, copper foil 506, prepreg 508, an imprinted sub-part 510, and/or an imprinted sub-part 512 are combined. According to some embodiments sub-parts 510 and 512 are imprinted thermoplastic dielectrics. A waveguide is fabricated using process 500 without the use of adhesive by laminating the two imprinted adjoining sub-parts 510 and 512 that form the waveguide. This lamination process allows adjoining metal surfaces of sub-parts 510 and 512 to touch, thus providing good EM (electromagnetic) contact along the length of the waveguide. Outer layer features of the combined device may be drilled, plated, imaged, etc. as needed.

Figure 6:
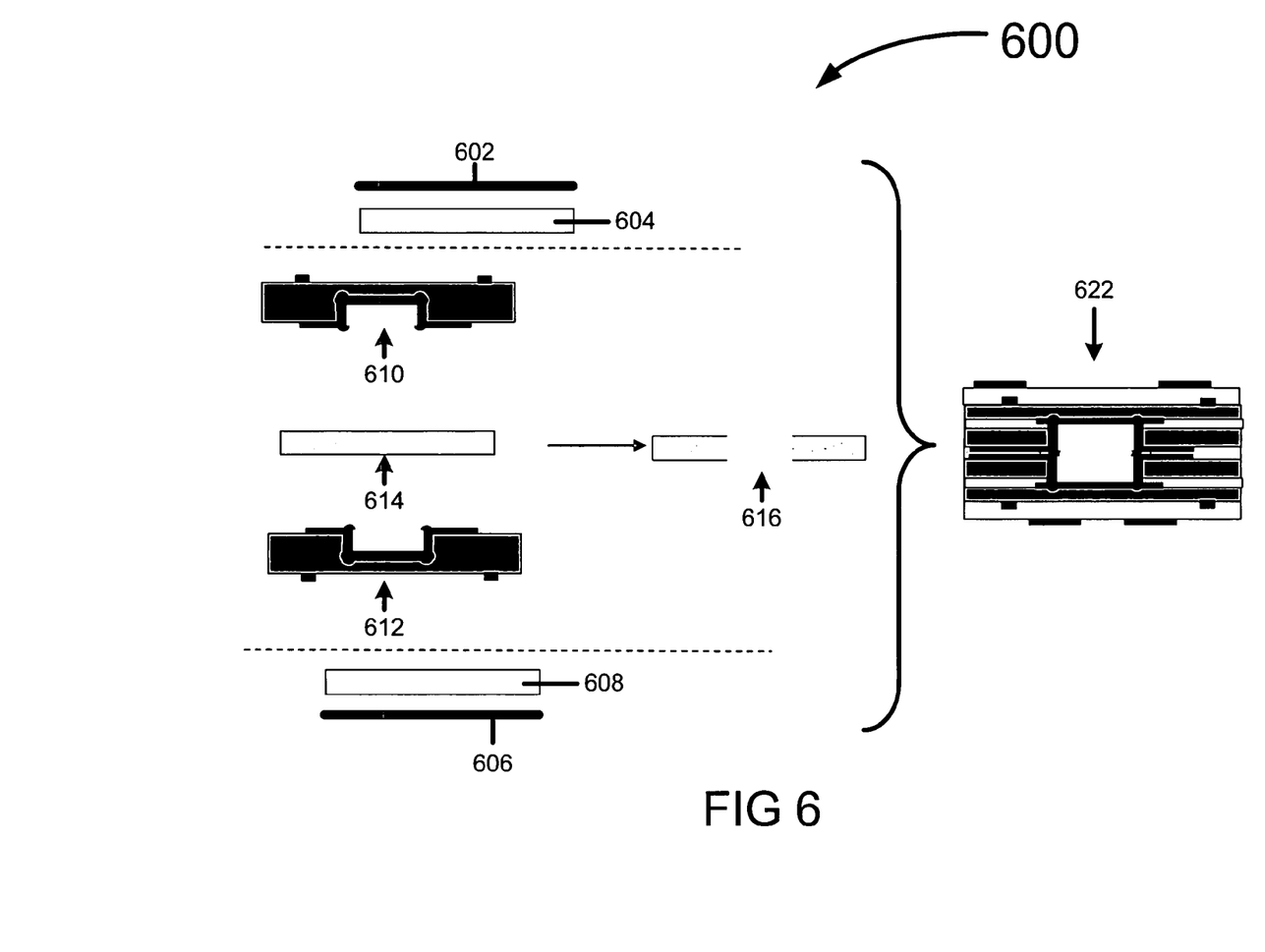
FIG. 6 illustrates a process of forming an imprinted waveguide according to some embodiments of the inventions.

FIG. 6 illustrates a process 600 of forming a waveguide according to some embodiments. According to some embodiments process 600 uses thermoset FR4 materials to fabricate a waveguide.

At a top portion illustrated in FIG. 6, process 600 includes using a copper foil 602 and a prepreg 604 to form a top portion of the waveguide PCB supporting traditional conductors. Similarly, at a bottom portion illustrated in FIG. 6, process 600 includes using a copper foil 606 and a prepreg 608 to form a bottom portion of the waveguide PCB supporting traditional conductors. An imprinted sub-part 610 and an imprinted sub-part 612 are also used in the process 600.

A low-flow or no-flow adhesive 614 is cut, lased, and/or punched, etc. at 616 so that no adhesive sits within an area of the waveguide. The result of the cut, lased, and/or punched, etc. adhesive at 616 is used to fabricate the waveguide by bonding the two imprinted sub-parts 610 and 612.

At 622 of process 600, the copper foil 602, prepreg 604, copper foil 606, prepreg 608, patterned adhesive form 616, imprinted sub-part 610, and/or imprinted sub-part 612 are combined. At 622 the imprinted sub-parts 610 and 612 are laminated using the patterned adhesive from 616. Depending on the thickness of the metal surfaces and the thickness of the adhesive, the metal surfaces and the adjoining parts may come into contact or be separated by a small gap. Outer layer features of the combined device may be drilled, plated, imaged, etc. as needed.

Figure 7:
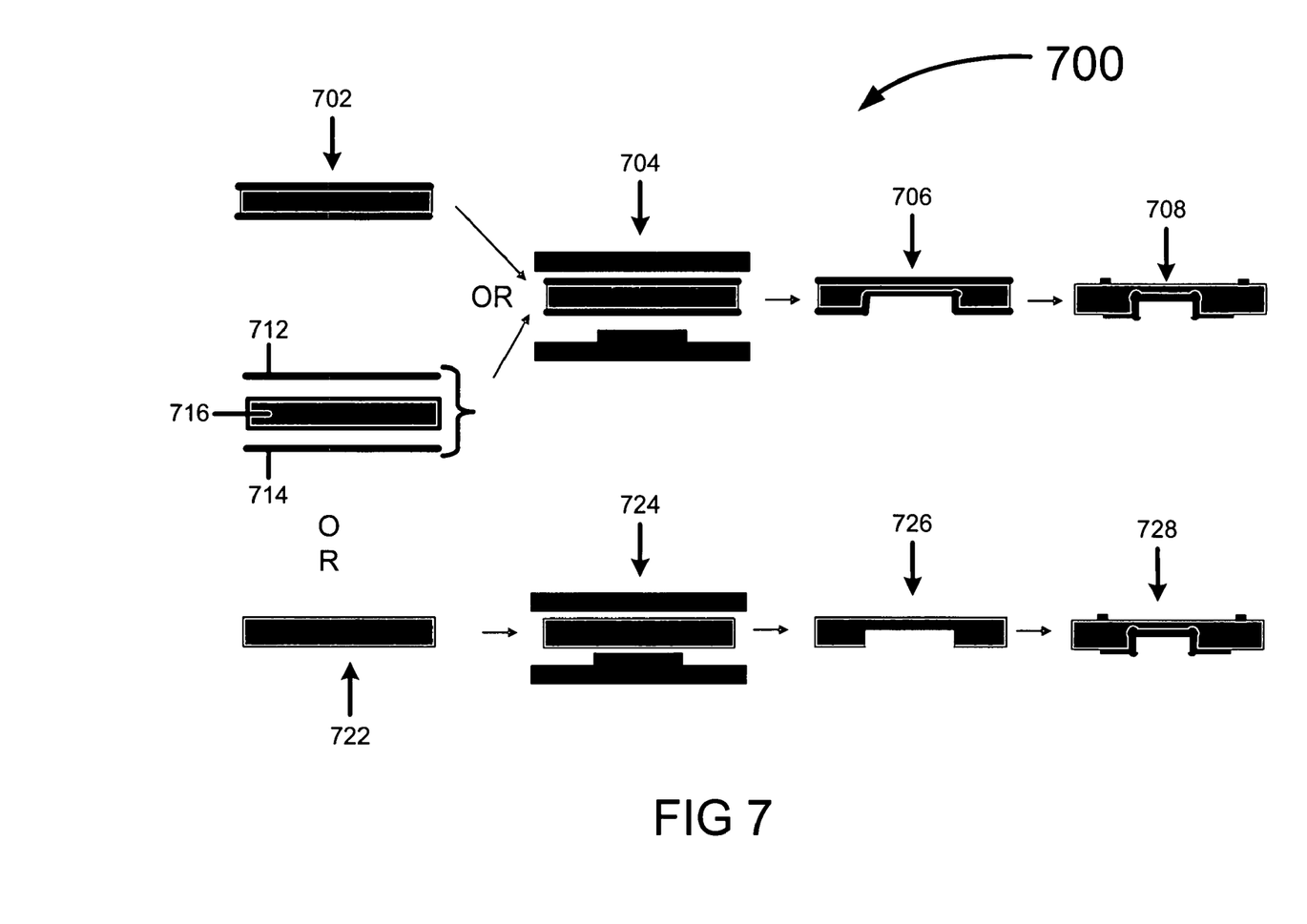
FIG. 7 illustrates processes of imprinting cores (and/or sub-parts) that are used to form a waveguide according to some embodiments of the inventions.

FIG. 7 illustrates processes 700 for imprinting cores (and/or sub-parts) that are used to form a waveguide according to some embodiments. According to some embodiments, the imprinted cores (and/or sub-parts) formed by processes 700 are used in a further process of forming a waveguide. For example, the imprinted cores (and/or sub-parts) formed by processes 700 may be used to provide sub-part 510 of FIG. 5, sub-part 512 of FIG. 5, sub-part 610 of FIG. 6, and/or sub-part 612 of FIG. 6.

The processes 700 illustrated in FIG. 7 include a first exemplary process using a copper clad thermoplastic material (and/or core) 702 according to some embodiments. The copper clad 702 acts as a release layer to the imprinting process and is the final metal for the core. The core 702 is hot pressed between two patterned press plates at 704. One of the press plates used at 704 (for example, the bottom press plate shown in FIG. 7 at 704) contains the reverse image of the waveguide to be formed. As the material is heated at 704 it softens and takes the form of the imaged press plate. According to some embodiments, depending on the thermoplastic material and release agent used, the copper cladding on the core 702 may be imaged before pressing at 704. According to some embodiments, the copper cladding on core 702 may be imaged after pressing at 704 (for example, at 706 in FIG. 7). The imprinted core is etched (and/or imaged) at 706 to form an imprinted part (or sub-part) 708.

The processes 700 illustrated in FIG. 7 include a second exemplary process using a thermoset material according to some embodiments. According to some embodiments the second exemplary process illustrated in FIG. 7 is similar to the first exemplary process of FIG. 7, except for utilizing a thermoset material. According to the second exemplary embodiment illustrated in FIG. 7 uses a copper foil 712, a copper foil 714, and a thermoset material 716 (for example, a thermoset B-stage material). According to some embodiments the copper foils 712 and 714 (copper cladding) is used for the release layer. During heat and pressure used during imprint press 704 using a patterned press plate the thermoset material 716 softens, is molded into shape, and then cured in the shape of the imaged press plate. Once formed at 704, the imprinted core is imaged and/or etched at 706 and processed into an imprinted part (or sub-part) 708.

The processes 700 illustrated in FIG. 7 include a third exemplary process using an unclad thermoplastic core 722 according to some embodiments. The success of this method relies on the release agent used to release the press plates at 724 once imprinted. After imaging at 724 and/or at 726 the part is plated and/or etched at 726 to form electroless copper, and processed to form an imprinted part (or sub-part) 728.

According to some embodiments, the imprinted cores (and/or sub-parts) 708 and/or 728 formed by one or more of the processes 700 are used in a further process of forming a waveguide. For example, the imprinted cores (and/or sub-parts) 708 and/or 728 formed by processes 700 may be used to provide sub-part 510 of FIG. 5, sub-part 512 of FIG. 5, sub-part 610 of FIG. 6, and/or sub-part 612 of FIG. 6.

Currently, when standard waveguides are used, they cannot easily be integrated within a digital system using PCB technology. According to some embodiments, quasi-waveguide structures allow for waveguide-like structures that exhibit most of the benefits of true waveguides, but can be incorporated into PCBs with fewer additional fabrication process steps.

According to some embodiments, a method for designing, establishing, and/or creating a quasi-waveguide within a PCB is provided. A quasi-waveguide is a structure that is not a true waveguide, but exhibits most of the properties that provide for efficient high frequency signal propagation at a lower cost.

According to some embodiments, a structure, process, material selection, and/or fabrication flow are provided to build a quasi-waveguide interconnect into a PCB.

According to some embodiments, one or more air filled quasi-waveguide is fabricated using existing PCB material and processes.

According to some embodiments, very high speed buses may be implemented in a digital system and/or in radio frequency (RF) integrated PCBs (for example, for telecom applications). According to some embodiments, air dielectric quasi-waveguides may be used within a PCB and/or scaling of standard low cost FR4 epoxy printed circuit materials are allowed.

According to some embodiments, a quasi-waveguide is created by forming a channel into a dielectric or multilayer PCB composite (for example, by routing, punching, and/or etching, etc.) The channel is then plated to form two side walls of the quasi-waveguide. The top and bottom sides of the quasi-waveguide are constructed from traditionally processed layers.

According to some embodiments, a quasi-waveguide is created by laminating PCB subparts containing the top, bottom, and side walls of the quasi-waveguide (for example, using thermoset adhesives and/or prepregs). The adhesive in the area of the channel is removed prior to lamination. According to some embodiments, the adhesive removal extends back away from the edges of the channel (for example, 20+ mils) to provide a buffer for material movement and adhesive flow during lamination.

According to some embodiments, thermoplastic cap layers are used to provide top and/or bottom quasi-waveguide surfaces. The thermoplastic material acts as the adhesive and the etch metal defining the quasi-waveguide surface is made slightly larger than the channel to account for material movement during lamination.

According to some embodiments, a quasi-waveguide is used to remove the roadblock caused by traditional transmission lines by extending signaling capability beyond 15-20 gigabits per second.

According to some embodiments, a quasi-waveguide is formed using FR4 materials and existing PCB manufacturing processes.

According to some embodiments a quasi-waveguide provides alternate interconnect structure within FR4 materials that will help eliminate a variation of dielectric loss and cross talk.

Figure 8:
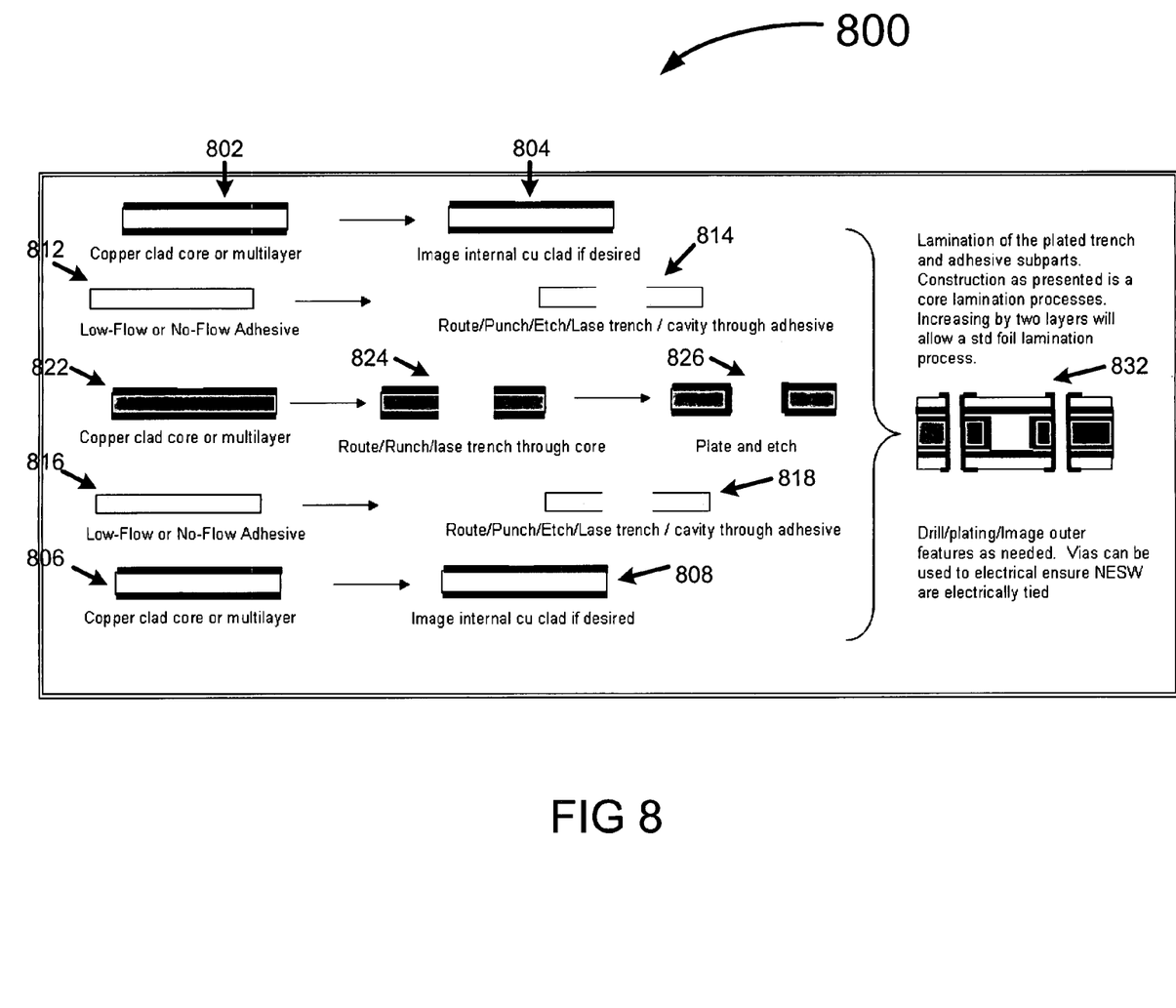
FIG. 8 illustrates a process of forming a quasi-waveguide according to some embodiments of the inventions.

FIG. 8 illustrates a process 800 of forming a quasi-waveguide according to some embodiments. According to some embodiments process 800 uses thermoset FR4 materials to form the quasi-waveguide.

A copper clad core or multilayer 802 is illustrated at the top portion of process 800 of FIG. 8. At 804 the internal copper clad 802 is imaged (if desired). Similarly, the bottom portion of process 800 of FIG. 8 illustrates a copper clad core or multilayer 806. At 808 the internal copper clad 806 is imaged (if desired).

A low-flow or non-flow adhesive is provided at 812. At 814 a channel, trench and/or cavity is routed, punched, etched, and/or lased, etc. in the adhesive 812. Similarly, a low-flow or non-flow adhesive is provided at 816. At 818 a channel, trench and/or cavity is routed, punched, etched, and/or lased, etc. in the adhesive 816. A copper clad core and/or multilayer is provided at 822, and a channel, trench and/or cavity is formed (for example, routed, punched, etched, and/or lased, etc.) in a portion of that copper clad core and/or multilayer at 824. Then, at 826 the core is plated and etched with the top and/or bottom of the channel/trench/cavity open.

At 832 a lamination is performed on the plated channel/trench/cavity from 826 and the adhesive sub-parts 814 and 818. The results of 804 and 808 are also combined with the other parts at 832. According to some embodiments, a waveguide is constructed using a core lamination process. According to some embodiments increasing the number of layers by two will allow a standard foil lamination process. Outer features of the combination may be drilled, plated, and/or imaged as necessary. Additionally, according to some embodiments vias are formed in the structure (for example, to electrically ensure that waveguide top, bottom and sides are electrically connected).

According to some embodiments, a key to the process 800 is generating an opening clearance in the prepreg/adhesive layer that is slightly larger than the quasi-waveguide to prevent adhesive flow into the quasi-waveguide during lamination.

Figure 9:
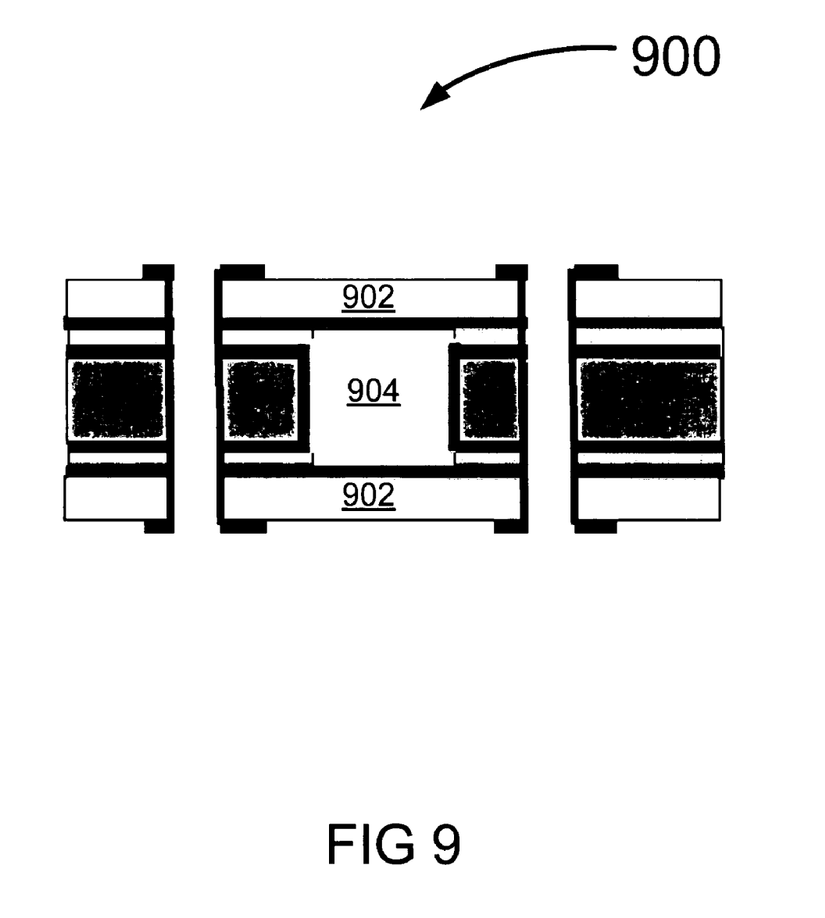
FIG. 9 illustrates a quasi-waveguide according to some embodiments of the inventions.

FIG. 9 illustrates a quasi-waveguide 900 according to some embodiments. According to some embodiments quasi-waveguide 900 may have been formed using the process 800 illustrated in FIG. 8, for example. Embedded quasi-waveguide 900 includes a thermoset cap dielectric 902 (for example, a standard thermoset cap dielectric) and a waveguide channel 904 defined by a routed and/or punched slot.

According to some embodiments, the process 800 and the waveguide 900 relate to an air filled waveguide. An air filled waveguide provides the lowest possible loss for any type of waveguide. In a waveguide the majority of the energy is concentrated in the dielectric instead of the conductor. Therefore, by using air in the waveguide instead of filling it with another material the channel losses are minimized.

Although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other form of propagated signals (e.g., carrier waves, infrared signals, digital signals, the interfaces that transmit and/or receive signals, etc.), and others.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Although flow diagrams and/or state diagrams may have been used herein to describe embodiments, the inventions are not limited to those diagrams or to corresponding descriptions herein. For example, flow need not move through each illustrated box or state or in exactly the same order as illustrated and described herein.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. A method comprising:
    forming a channel in printed circuit board material;
    plating the formed channel to form at least two side walls of an embedded waveguide; and
    laminating printed circuit board material to the plated channel;
    wherein the channel is formed in two copper clad cores; and
    wherein a thermoplastic cap material adheres to a top of the channel during lamination.

2. The method of claim 1, wherein the channel is formed in a copper clad core.

3. The method of claim 1, wherein the formed channel is plated and etched with copper support on one side of the channel.

4. The method of claim 1, wherein the formed channel is plated and etched with a top and bottom of the channel open.

5. The method of claim 1, wherein thermoplastic dielectrics are laminated to the plated channel.

6. A method comprising:
    forming a channel in printed circuit board material;
    plating the formed channel to form at least two side walls of an embedded waveguide; and laminating printed circuit board material to the plated channel;
wherein the channel is formed in two copper clad cores; and
wherein a thermoplastic cap material adheres to a top of the channel and to a bottom of the channel during lamination.

7. A method comprising:
forming a channel in printed circuit board material;
plating the formed channel to form at least two side walls of an embedded waveguide; and
laminating printed circuit board material to the plated channel;
wherein the channel is formed in two copper clad cores; and
wherein a conductor is laminated over the channel using an adhesive.

8. The method of claim 7, wherein the adhesive is removed in an area of the channel prior to lamination.

9. The method of claim 1, wherein the channel in each of the two copper clad cores is plated and etched.

10. The method of claim 1, wherein the embedded waveguide is an air filled waveguide.

11. The method of claim 1, wherein the embedded waveguide is a high speed interconnect.

12. A method comprising:
forming a channel in printed circuit board material;
plating the formed channel to form at least two side walls of an embedded waveguide; and
laminating printed circuit board material to the plated channel;
wherein the channel is formed in two copper clad cores; and
wherein the laminating laminates printed circuit board material containing the two side walls and laminates printed circuit board material containing a top and a bottom of the waveguide.

13. The method of claim 1, wherein the printed circuit board material includes low cost FR4 material.

14. The method of claim 1, wherein the channel is formed in a dielectric material.

15. The method of claim 1, wherein the channel is formed in a multilayer printed circuit board composite.

16. An embedded waveguide comprising:
a channel formed in printed circuit board material;
at least two plated side walls of the channel; and
printed circuit board material laminated to the channel;
wherein the channel is formed in two copper clad cores; and
wherein a thermoplastic cap material adheres to a top of the channel.

17. The embedded waveguide of claim 16, wherein the channel is formed in a copper clad core.

18. The embedded waveguide of claim 16, wherein the formed channel is plated and etched with copper support on one side of the channel.

19. The embedded waveguide of claim 16, wherein the formed channel is plated and etched with a top and bottom of the channel open.

20. The embedded waveguide of claim 16, wherein thermoplastic dielectrics are laminated to the plated channel.

21. An embedded waveguide comprising:
a channel formed in printed circuit board material;
at least two plated side walls of the channel; and
printed circuit board material laminated to the channel;
wherein the channel is formed in two copper clad cores; and
wherein a thermoplastic cap material adheres to a top of the channel and to a bottom of the channel.

22. An embedded waveguide comprising:
a channel formed in printed circuit board material;
at least two plated side walls of the channel; and
printed circuit board material laminated to the channel;
wherein the channel is formed in two copper clad cores; and
wherein a conductor is laminated over the channel using an adhesive.

23. The embedded waveguide of claim 22, wherein the adhesive is not included in an area of the channel.

24. The embedded waveguide of claim 16, wherein the channel in each of the two copper clad cores is plated and etched.

25. The embedded waveguide of claim 16, wherein the embedded waveguide is an air filled waveguide.

26. The embedded waveguide of claim 16, wherein the embedded waveguide is a high speed interconnect.

27. The embedded waveguide of claim 16, wherein the printed circuit board material includes low cost FR4 material.

28. The embedded waveguide of claim 16, wherein the channel is formed in a dielectric material.

29. The embedded waveguide of claim 16, wherein the channel is formed in a multilayer printed circuit board composite.

* * * * *